US007793192B2

(12) United States Patent
Tamura et al.

(10) Patent No.: US 7,793,192 B2
(45) Date of Patent: Sep. 7, 2010

(54) SEMICONDUCTOR MEMORY DEVICE

(75) Inventors: Kazuaki Tamura, Osaka (JP); Tomoaki Izumi, Osaka (JP); Tetsushi Kasahara, Osaka (JP); Masahiro Nakanishi, Kyoto (JP); Kiminori Matsuno, Osaka (JP); Manabu Inoue, Osaka (JP)

(73) Assignee: Panasonic Corporation, Osaka (JP)

( * ) Notice: Subject to any disclaimer, the term of this patent is extended or adjusted under 35 U.S.C. 154(b) by 896 days.

(21) Appl. No.: 11/568,470

(22) PCT Filed: Apr. 25, 2005

(86) PCT No.: PCT/JP2005/007785

§ 371 (c)(1),
(2), (4) Date: Jan. 11, 2007

(87) PCT Pub. No.: WO2005/109446

PCT Pub. Date: Nov. 17, 2005

(65) Prior Publication Data

US 2007/0277076 A1    Nov. 29, 2007

(30) Foreign Application Priority Data

May 6, 2004 (JP) ............................. 2004-137399

(51) Int. Cl.
H03M 13/03 (2006.01)
(52) U.S. Cl. ..................................................... 714/763
(58) Field of Classification Search ................ 714/763, 714/769, 770; 711/103
See application file for complete search history.

(56) References Cited

U.S. PATENT DOCUMENTS 5,603,001 A * 2/1997 Sukegawa et al. ........... 711/103
6,769,087 B2 * 7/2004 Moro et al. .................. 714/763
6,868,007 B2   3/2005 Hasegawa et al. ....... 365/185.09
7,012,835 B2 * 3/2006 Gonzalez et al. ........ 365/185.11
7,054,991 B2 * 5/2006 Tanaka et al. ............... 711/103
7,076,722 B2   7/2006 Shibata ....................... 714/763
7,136,986 B2 * 11/2006 Han et al. .................... 711/203

FOREIGN PATENT DOCUMENTS

| JP | 2001-509941 | 7/2001 |
|---|---|---|
| JP | 2003-157697 | 5/2003 |
| JP | 2003-186758 | 7/2003 |

(Continued)

OTHER PUBLICATIONS

U.S. Appl. No. 10/598,307 to Nakanishi et al., which was filed on Aug. 24, 2006.

(Continued)

Primary Examiner—Shelly A Chase
(74) Attorney, Agent, or Firm—Greenblum & Bernstein, P.L.C.

(57) ABSTRACT

A semiconductor memory device in which data is not written in a transfer destination under a state including an error when an error occurs at the time of reading data at the transfer destination. The semiconductor memory device (1) comprising a nonvolatile memory (2) having a data writing unit smaller than a physical block is provided with an error detecting/correcting circuit (23) in the non-volatile memory (2). When data stored in a specified block of the non-volatile memory (2) is transferred to a different physical block and written, the error detecting/correcting circuit (23) performs error detection and correction of data.

2 Claims, 7 Drawing Sheets

FOREIGN PATENT DOCUMENTS

JP          2003-242788          8/2003

OTHER PUBLICATIONS

English language abstract of JP 2003-242788, Aug. 29, 2003.
English language abstract of JP 2003-186758, Jul. 4, 2003.
English language abstract of JP 2003-157697, May 3, 2003.
Japanese Translation of PCT International Application No. 2001-509941 A, together with an English language Claims of the same, Jul. 4, 2001.

* cited by examiner

FIG. 7

| | Existence or nonexistence of error detecting/correcting circuit | | | | Circuit scale of error detecting/correcting circuit | | Order of write processing rate | |
|---|---|---|---|---|---|---|---|---|
| | Memory controller | | Non-volatile memory | | Memory controller | Non-volatile memory | Error | No error |
| | Error detecting | Error correcting | Error detecting | Error correcting | | | | |
| Comparative example | ○ | ○ | — | — | Large | — | 3 | 4 |
| Embodiment 1 | — | — | ○ | ○ | — | Large | 1 | 1 |
| Embodiment 2 | ○ | ○ | ○ | ○ | Large | Medium | 1 or 2 | 1 |
| Embodiment 3 | ○ | ○ | ○ | — | Large | Small | 3 | 1 |

SEMICONDUCTOR MEMORY DEVICE

TECHNICAL FIELD

The present invention relates to a semiconductor memory device that can execute processing such as an error correction when transferring and writing data in a non-volatile memory.

BACKGROUND ART

A recording medium for recording digital data such as music contents and image data has various forms such as a magnetic disk, optical disk, and magneto optical disk. A semiconductor memory card, another example of the recording medium, uses non-volatile semiconductor memory such as a flash memory as memory device and is becoming widely used mainly in small-sized portable device such as a digital still camera and cellular phone terminal because the recording medium can be miniaturized.

In the flash memory used as the memory device, an erase unit is different from a writing unit. In addition, the flash memory characteristically cannot overwrite data to a page that is a writing unit in a physical block in which data is already stored. For this reason, the flash memory has such a problem that memory area is wastefully consumed when written data is overwritten, that is, data is rewritten.

When data is rewritten, conventionally, data already existing in a block has been evacuated to an external memory, and rewriting data has been written to a pertinent block in a non-volatile memory after the rewriting data is recorded in an external memory once. A method is disclosed in Patent document 1 for this method. In the method, when data is rewritten, rewriting data is written to a free physical block, and then the other data before rewriting stored in the physical block is written (copied) to the physical block in which the rewriting data is written. As a result, the physical block having data before rewriting has no valid data, erasing can be completed without losing valid data, reusing the initial physical block becomes possible, and limited physical blocks can be effectively used.

Patent document 1: Unexamined Patent Publication 2001-509941.

DISCLOSURE OF INVENTION

Problems to be Solved by the Invention

However, there is a following problem in the method of Patent document 1. That is to say, when data transferring/writing is executed in a non-volatile memory, processing such as error correction is not executed, therefore, if error occurs in reading data to be transferred, the data is written in a transferring destination as it is, that is, in the state where the error is included. As a result, when the written data is tried to be read next time, there is such a problem that the data can not be read or the data is read as different data.

Means to Solve the Problems

To solve the problem, a semiconductor memory device of the present invention comprising: a non-volatile memory including a data error detecting/correcting circuit and memory area consisting of a plurality of physical blocks that is minimum erase unit of data and in which data writing unit is smaller than the minimum erase unit; and a memory controller for controlling write and read of data in said non-volatile memory, wherein when said memory controller transfers and writes data recorded in a predetermined physical block in said non-volatile memory to a physical block different from said predetermined physical block, said memory controller controls processing so that said error detecting/correcting circuit executes error detecting/correcting to data of said physical block.

To solve the problem, a semiconductor memory device of the present invention comprising: a non-volatile memory including a data error detecting/correcting circuit and memory area consisting of a plurality of physical blocks that is minimum erase unit of data and in which data writing unit is smaller than the minimum erase unit; and a memory controller for controlling write and read of data in said non-volatile memory, including an error correcting circuit having higher error correcting ability than that of said error detecting/correcting circuit in said non-volatile memory, wherein when said memory controller transfers and writes data recorded in a predetermined physical block in said non-volatile memory to a physical block different from said predetermined physical block, said memory controller controls processing so that said error detecting/correcting circuit detects existence or nonexistence of error in transferred data, determines whether error correction is possible when error exists, corrects data recorded in said predetermined physical block when error correction is possible, controls processing to transfer data to said error correcting circuit in said memory controller when error correction is impossible, and controls processing so that said error correcting circuit in said memory controller corrects the error in the transferred data of said predetermined physical block.

To solve the problem, a semiconductor memory device of the present invention comprising: a non-volatile memory including a data error detecting/correcting circuit and memory area consisting of a plurality of physical blocks that is minimum erase unit of data and in which data writing unit is smaller than the minimum erase unit; and a memory controller for controlling write and read of data in said non-volatile memory, including an error correcting circuit, wherein when transferring and writing data recorded in a predetermined physical block in said non-volatile memory to a physical block different from said predetermined physical block, said memory controller controls processing so that an error detecting circuit in said non-volatile memory detects existence or nonexistence of error in transferred data, and transfers the data to the error correcting circuit in said memory controller when error exists, and so that the error correcting circuit in said memory controller corrects the error in the transferred data of said predetermined physical block.

Effectiveness of the Invention

The semiconductor memory device of the present invention can improve data reliability since the error detecting/correcting process is provided in copying data in the non-volatile memory between physical blocks. A semiconductor memory card has an error detecting/correcting circuit. After completion of error detecting and correcting of data recorded in a predetermined physical block in the non-volatile memory, data can be transferred and written to a physical block different from the predetermined physical block, therefore data reliability can be improved and high rate processing can be realized since the processing is executed only in the non-volatile memory without transferring data to the memory controller.

In addition, since the semiconductor memory card has the error detecting/correcting circuit in the non-volatile memory, data reliability can be improved and high rate processing can be realized since the processing is executed in the non-volatile memory without transferring data to the memory controller when error can be corrected by the error detecting/correcting circuit in the non-volatile memory. Furthermore, when the error cannot be corrected by the error detecting/correcting circuit in the non-volatile memory, data reliability can be further improved since data is written in the non-volatile memory after completion of data transferring to the memory controller and error correcting in the memory controller.

In addition, since the semiconductor memory card has only error detecting circuit in the non-volatile memory, copying between blocks can be realized at high rate when error is not detected and price reduction of a non-volatile memory can be realized along with improving reliability.

BRIEF DESCRIPTION OF DRAWINGS

FIG. 7 is a view assembling processing rates and circuit scales of Embodiment 1, 2, and 3 and comparative example.

DESCRIPTION OF REFERENCE NUMERALS

Figure 1:
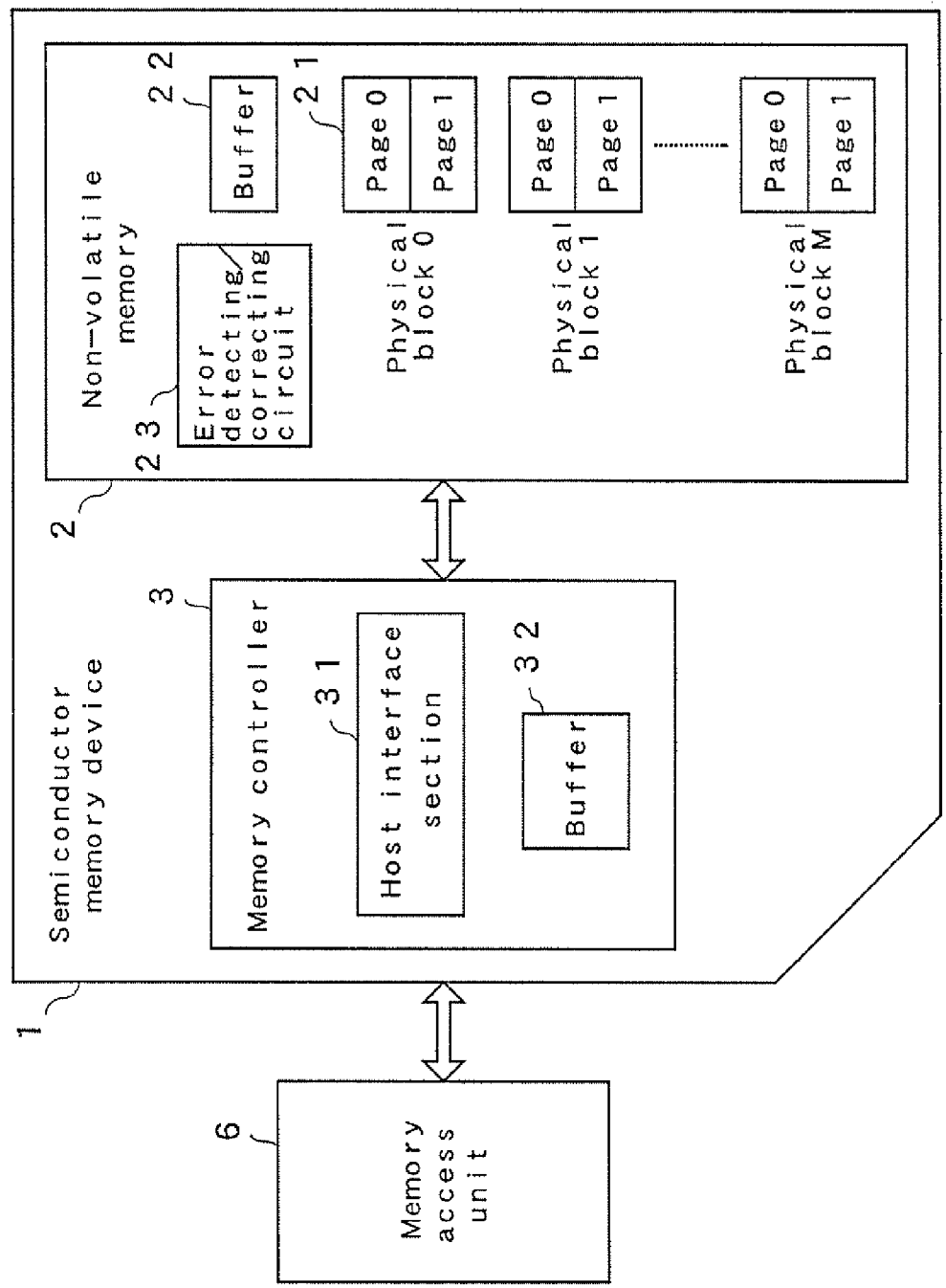
FIG. 1 is a configuration view of a semiconductor memory device according to Embodiment 1 of the present invention.

1 Semiconductor memory device
2 Non-volatile memory
3 Memory controller
6 Memory access unit
22, 32 Buffer
23, 33 Error detecting/correcting circuit
25 Error detecting circuit
31 Host interface section
34 Error correcting circuit

BEST MODE FOR CARRYING OUT THE INVENTION

Embodiments of a semiconductor memory device of the present invention will be described below referring to figures.

Embodiment 1

A configuration of a semiconductor memory device of Embodiment 1 is shown in FIG. 1. A semiconductor memory device 1 mainly includes a non-volatile memory 2 and memory controller 3. The non-volatile memory 2 consists of AND type flash memory. The non-volatile memory 2 includes a plurality of physical blocks 21 (physical block 0~physical block M) that is a minimum unit of data erasing and that have a size of 4 kB. Each physical block is a minimum unit of data writing and consists of 2 pages (page 0, 1). A size of each page is 2 kB. In Embodiment 1, data is already written in page 0 and page 1 of the physical block 0 and other physical blocks are in an unwritten state, that is, in an erased state.

In addition, the non-volatile memory 2 includes a buffer 22 for temporarily retaining data at data reading and writing and error detecting/correcting circuit 23 for detecting and correcting error. A specification of the error detecting/correcting circuit 23 is set to have an ability to detect up to 4 bits error and to correct up to 3 bits error for example. Data transfer between the memory controller 3 and non-volatile memory 2 is executed using 4 bits data width.

The memory controller 3 includes a host interface section 31 for receiving/sending data to a memory access unit 6 that is a host device and buffer 32 for temporarily retaining data.

Figure 2:
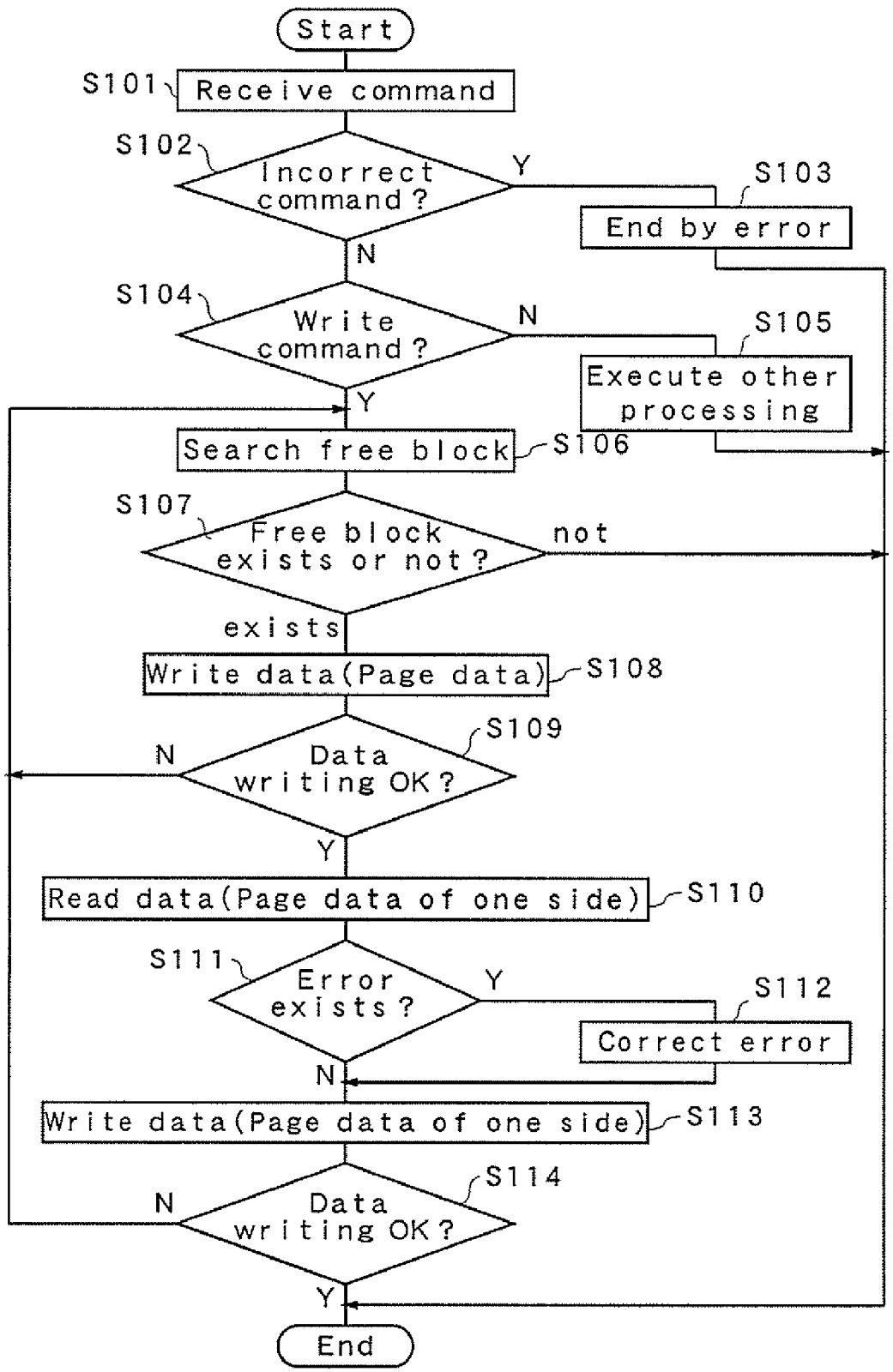
FIG. 2 is a flow chart showing a processing in Embodiment 1 of the present invention.

Next, internal operations of the semiconductor memory device in Embodiment 1 will be described using FIG. 2. FIG. 2 is a processing flow in executing a data overwrite processing. As described above, a concrete processing in the case of overwriting data in the page 0 of the physical block 0 in which data is already written, that is, in the case of rewriting data will be described.

At first, a command and argument sent from the memory access unit 6 are received through the host interface section 31 of the memory controller 3 (S101). And then, the received command is referred and it is determined whether the command is an incorrect command that cannot be recognized by itself (S102). In the case of an incorrect command, error is informed to the memory access unit 6 and the processing finishes (S103). In the case of a correct command, it is determined whether the command is a write command (S104). In the case of commands other than the write command, other processing corresponding to each command is executed (S105). In the case of the write command, it is determined, by information stored in an argument, that overwrite of data in page 0 of the physical block 0, that is, rewrite is required.

Since a characteristic of the flash memory used as the non-volatile memory 2 in Embodiment 1 prevents a overwrite processing to same physical block here, other free physical block is searched (S106). If there is no free physical block, write processing is stopped (S107). In Embodiment 1, since both pages of the physical block 1 are unused as described above, data in page 0 of the physical block 0 is rewritten to page 0 of the physical block 1, that is, data of 1 page is written (S108). When the writing fails, the processing returns to the search of free block (S106). When the writing succeeds, data already written in page 1 of the physical block 0 is read (S110) and the processing transfers to a write processing to page 1 of the physical block 1.

The reason why the processing is executed is described below. That is to say, at the timing when rewriting data in page 0 of the physical block 0 is written to page 0 of the physical block 1, data in page 0 of the physical block 0 becomes invalid data. However, data in page 1 of the physical block 0 remains as valid data. Since a minimum erase unit is a physical block unit as described above and as far as valid data in page 1 of the physical block 0 remains, reuse, that is, erase of the physical block 0 is impossible. But, even when data is retained in page 1 of the physical block 0, it is possible to set the physical block 0 to a valid block for next data writing by copying valid data in page 1 of the physical block 0 to page 1 of the physical block 1 after rewriting data is written to page 0 of the physical block 1. For the reasons mentioned above, a copy operation of valid data in a non-volatile memory is required.

In addition, data already written in page 1 of the physical block 0 is read (S110) and the data is sent to the error detecting/correcting circuit 23 via the buffer 22 in the non-volatile memory 2. The error detecting/correcting circuit 23 detects error based on an error correcting code added to the data (S111). When error is detected in the data, after the error detecting/correcting circuit 23 corrects the error (S112), the corrected data is written to page 1 of the physical block 1 (S113). On the other hand, when error is not detected in the data by the error detecting/correcting circuit 23, the data is written to page 1 of the physical block 1 without error correction (S113). Next, when data writing fails, the processing is repeated from the search of free block (S106). The processing finishes when data writing succeeds.

In addition, since kinds and pieces of the flash memory used as the non-volatile memory used in Embodiment 1, capacities and configurations of the physical block, and so on are not specified, same effects are obtained in different combinations. In addition, even when an ability of an error detecting/correcting circuit is equivalent to or lower or higher than that of the error detecting/correcting circuit of Embodiment 1, almost the same effect is obtained.

Figure 3:
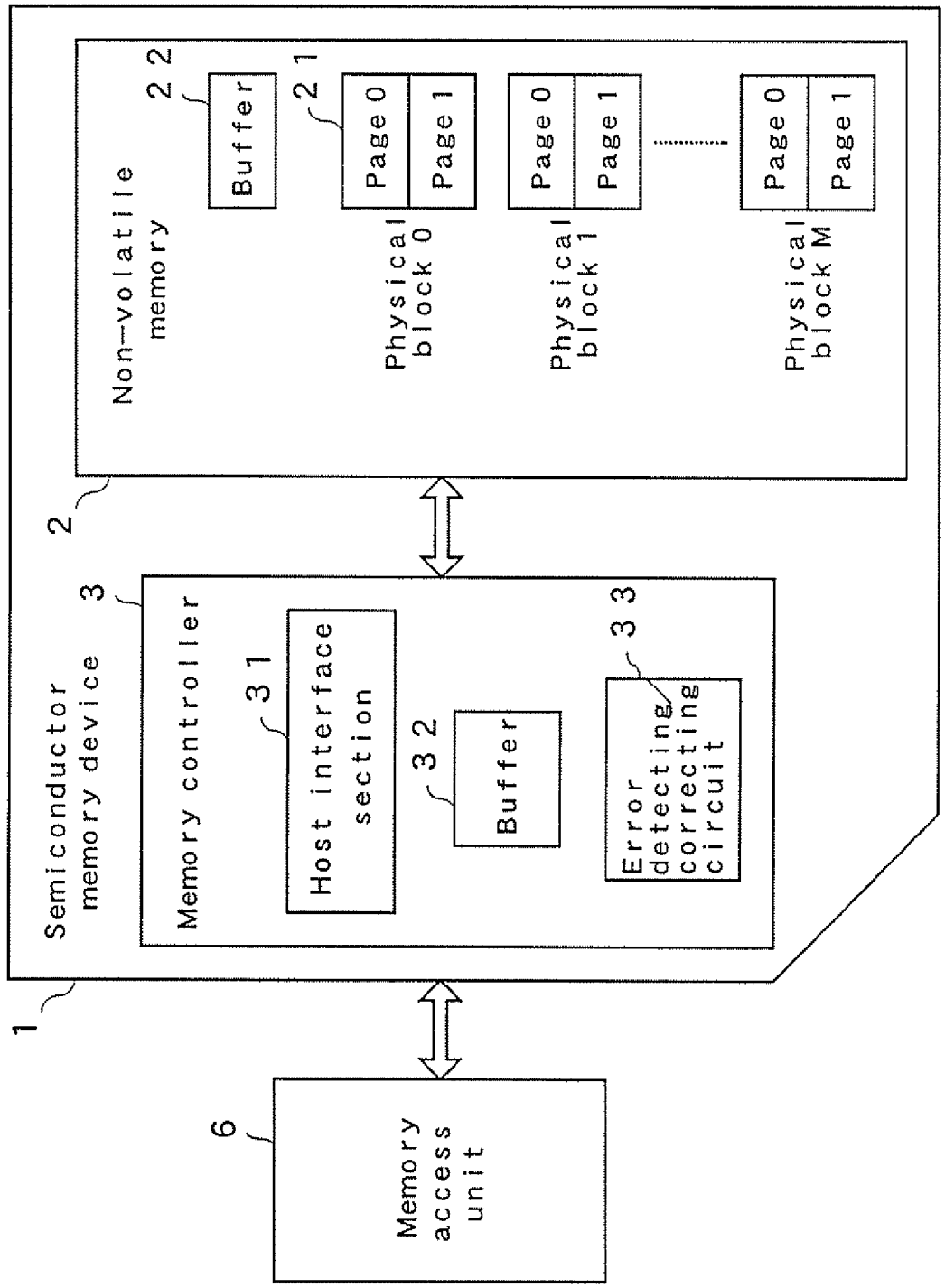
FIG. 3 is a configuration view of a semiconductor memory device of a comparative example.

Next, a semiconductor memory device of a comparative example will be described based on FIG. 3. A basic configuration of the semiconductor memory device in the comparative example is the same as that shown in FIG. 1, but the memory device is different from Embodiment 1 in that an error detecting/correcting circuit is not included in a non-volatile memory and the error detecting/correcting circuit 33 that is equivalent to Embodiment 1 is included in the memory controller 3. A flow chart of an internal processing is the same as that shown in FIG. 2. It is different from Embodiment 1 that the data is not transferred from within the non-volatile memory 2 to outside in Embodiment 1 when data in page 1 of the physical block 0 is copied, but the data is transferred to the error detecting/correcting circuit 33 in the memory controller 3 once routing through the buffer 22 in the non-volatile memory 2 in the comparative example. That is to say, an error detecting/correcting processing of data is completed in the non-volatile memory 2 in Embodiment 1, but the processing is not completed in the comparative example. Since data transfer between the memory controller 3 and the non-volatile memory 2 is executed with only 4 bits data width, Embodiment 1 can realize a high rate processing especially when data size is large.

Embodiment 2

Figure 4:
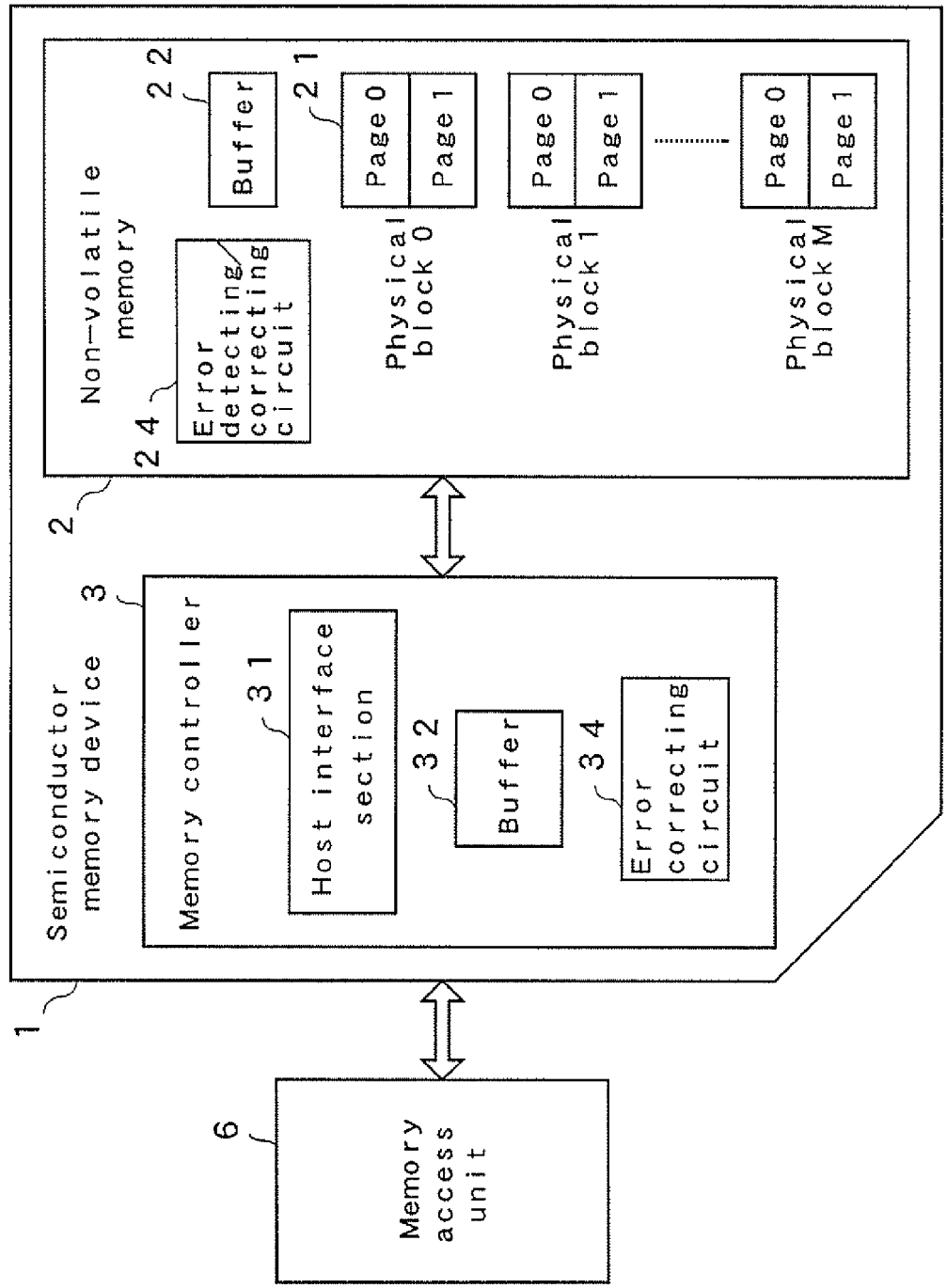
FIG. 4 is a configuration view of a semiconductor memory device according to Embodiment 2 of the present invention.

Next, a semiconductor memory device of Embodiment 2 will be described based on FIG. 4. A basic configuration of the semiconductor memory device in Embodiment 2 is the same as that shown in FIG. 1, but an error detecting/correcting circuit 24 whose error detecting ability is equivalent to and error correcting ability is inferior to those of Embodiment 1 is included in the non-volatile memory 2. In addition, an error correcting circuit 34 having an error correcting ability equivalent to that of Embodiment 1 is included in the memory controller 3. The error correcting circuit 34 may include an error detecting function. These points are different from Embodiment 1.

Figure 5:
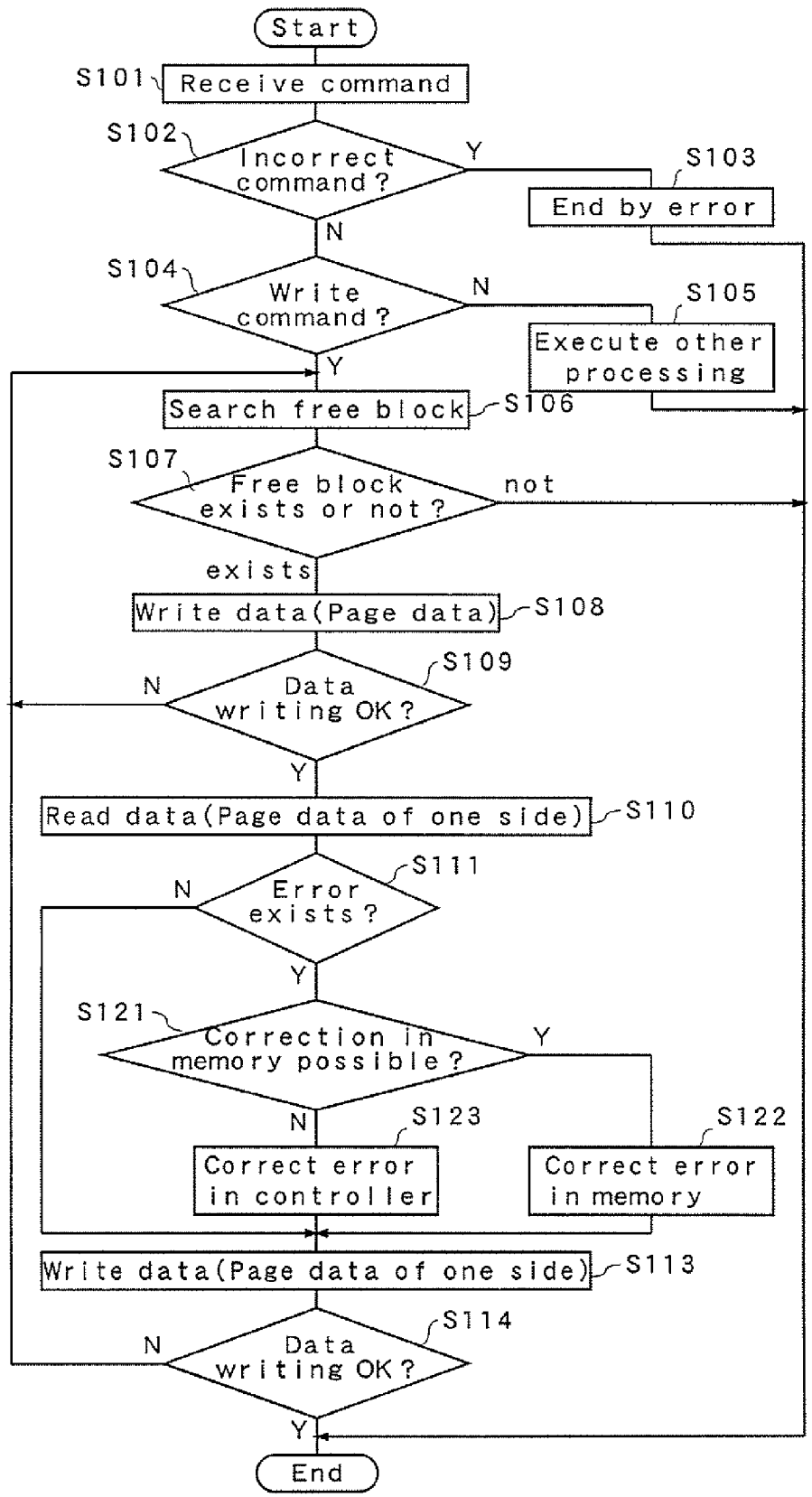
FIG. 5 is a flow chart showing a processing in Embodiment 2 of the present invention.

An internal processing flow will be described using FIG. 5. Since this flow is almost the same as that shown in FIG. 2, different points will be described. Points different from Embodiment 1 are as follows: when an error is detected in the error detecting/correcting circuit 24 in the non-volatile memory 2 at S111, it is determined whether the error can be corrected by the error detecting/correcting circuit 24 (S121). When error correction is possible, the error is corrected by the error detecting/correcting circuit 24 in the step S122. Data that is impossible to be corrected is temporarily retained in the buffer 22 in the non-volatile memory 2. And, the error data is corrected by the error correcting circuit 34 that has higher correcting ability than that of the error detecting/correcting circuit 24. After that, the corrected data is retrieved from the buffer 22 and the data is written to page 1 of the physical block 1 in the non-volatile memory 2 (S113). By using these configurations, miniaturization of circuit scale of the error detecting/correcting circuit 24 in the non-volatile memory 2, miniaturization of a chip size, and price reduction of a non-volatile memory can be realized along with improving data reliability.

Embodiment 3

Figure 6:
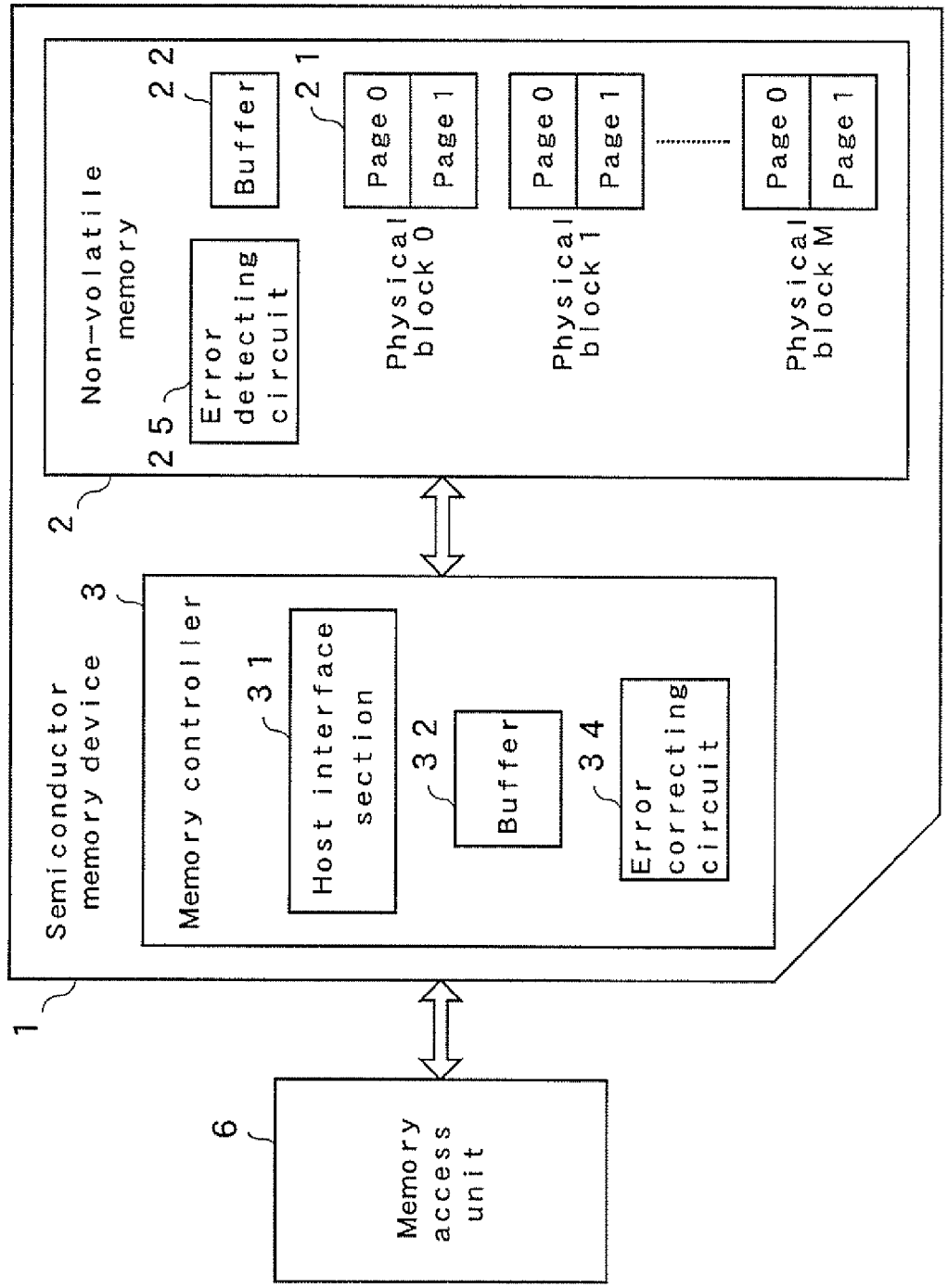
FIG. 6 is a configuration view of a semiconductor memory device according to Embodiment 3 of the present invention.

Next, a semiconductor memory device of Embodiment 3 will be described based on FIG. 6. A basic configuration of the semiconductor memory device in Embodiment 3 is the same as that shown in Embodiment 2, but it is different from Embodiment 2 that only an error detecting circuit 25 is included in the non-volatile memory 2. An internal processing flow is almost the same as that shown in FIG. 2. Points different from Embodiment 2 are as follows: error data detected by the error detecting circuit 25 in the non-volatile memory 2 is all sent to the memory controller 3 via the buffer 22 in the non-volatile memory 2. And, after the data is corrected by the error correcting circuit 34 in the memory controller 3, the corrected data is written to page 1 of the physical block 1 in the non-volatile memory 2 at S113. As described above, the error correcting circuit 34 may include an error detecting function. By using these configurations, since only the error detecting circuit 25 is included in the non-volatile memory 2, miniaturization of a chip size, and price reduction can be realized along with improving data reliability.

FIG. 7 is a view assembling processing rate and circuit scale of Embodiment 1, 2, and 3 and comparative example described above. As shown in the figure, a non-volatile memory includes at least an error detecting circuit in each Embodiment of the present invention. This can improve processing rate compared to that of the comparative example when no error occurs. When error occurs, processing rate of Embodiment 1, 2 is higher than that of the comparative example and processing rate of Embodiment 3 is almost equivalent to that of the comparative example.

INDUSTRIAL APPLICABILITY

A semiconductor memory device of the present invention can improve data reliability in copying data in a non-volatile memory. This Semiconductor memory device can be used in a digital AV apparatus, mobile phone terminal, PC, and so on using a semiconductor memory device as a recording medium. In addition, the semiconductor memory device well works especially when used in an apparatus frequently rewriting data.

The invention claimed is:

1. A semiconductor memory device comprising:
 a non-volatile memory including a data error detecting/correcting circuit and memory area consisting of a plurality of physical blocks that is minimum erase unit of data and in which data writing unit is smaller than the minimum erase unit; and
 a memory controller for controlling write and read of data in said non-volatile memory, including an error correcting circuit having higher error correcting ability than that of said error detecting/correcting circuit in said non-volatile memory, wherein
 when said memory controller transfers and writes data recorded in a predetermined physical block in said non-volatile memory to a physical block different from said predetermined physical block, said memory controller controls processing so that said error detecting/correcting circuit detects existence or nonexistence of error in transferred data, determines whether error correction is possible when error exists, corrects data recorded in said predetermined physical block when error correction is possible, controls processing to transfer data to said error correcting circuit in said memory controller when error correction is impossible, and controls processing so that said error correcting circuit in said memory controller corrects the error in the transferred data of said predetermined physical block.

2. A semiconductor memory device comprising:

a non-volatile memory including a data error detecting/correcting circuit and memory area consisting of a plurality of physical blocks that is minimum erase unit of data and in which data writing unit is smaller than the minimum erase unit; and a memory controller for controlling write and read of data in said non-volatile memory, including an error correcting circuit, wherein when transferring and writing data recorded in a predetermined physical block in said non-volatile memory to a physical block different from said predetermined physical block, said memory controller controls processing so that an error detecting circuit in said non-volatile memory detects existence or nonexistence of error in transferred data, and transfers the data to the error correcting circuit in said memory controller when error exists, and so that the error correcting circuit in said memory controller corrects the error in the transferred data of said predetermined physical block.

* * * * *